US008067952B2

(12) United States Patent
Ker et al.

(10) Patent No.: US 8,067,952 B2
(45) Date of Patent: Nov. 29, 2011

(54) SYSTEM-LEVEL ESD DETECTION CIRCUIT

(75) Inventors: Ming-Dou Ker, Hsinchu (TW); Wen-Yi Chen, Taipei (TW); Hsin-Chin Jiang, Taipei (TW)

(73) Assignee: Amazing Microelectronic Corp., Jhonghe, Taipei County (TW)

( * ) Notice: Subject to any disclaimer, the term of this patent is extended or adjusted under 35 U.S.C. 154(b) by 818 days.

(21) Appl. No.: 12/283,868

(22) Filed: Apr. 18, 2008

(65) Prior Publication Data

US 2009/0287435 A1 Nov. 19, 2009

(51) Int. Cl.
*G01R 31/02* (2006.01)
*G01R 31/26* (2006.01)
(52) U.S. Cl. .............................. 324/762.01; 324/762.07
(58) Field of Classification Search ........................ None
See application file for complete search history.

(56) References Cited

U.S. PATENT DOCUMENTS 7,593,204 B1 * 9/2009 Iversen et al. .................... 361/56

* cited by examiner

*Primary Examiner* — Roberto Velez
(74) *Attorney, Agent, or Firm* — Morris Manning & Martin LLP; Tim Tingkang Xia, Esq.

(57) ABSTRACT

An ESD detection circuit for detecting a level of an ESD voltage on a power rail is provided. The ESD detection circuit includes a resistive component, a diode unit, and a controller. The resistive component is coupled between a detection node and a ground node corresponding to the power rail. The diode unit is coupled between the power rail and the detection node in a forward direction toward the power rail. The controller, coupled to the detection node, is used for determining the level of the ESD voltage based on the voltage of the detection node and the breakdown voltage of the diode unit.

10 Claims, 5 Drawing Sheets

SYSTEM-LEVEL ESD DETECTION CIRCUIT

BACKGROUND OF THE INVENTION

1. Field of the Invention

The present invention is related to an electrostatic discharge (ESD) detection circuit. In particular, the present invention relates to a system-level ESD detection circuit.

2. Description of the Prior Art

As the scale of devices in ICs has become smaller, the devices have become more vulnerable to Electrostatic discharge (ESD). Hence, ESD has been one of the most important reliability issues for IC products and must be taken into consideration in the design phase of all ICs.

To meet the component-level ESD reliability, many on-chip ESD protection circuits have been proposed and added to the I/O cells and power cells of CMOS ICs. However, besides the component-level ESD stress, system-level ESD issue is also an increasingly significant reliability issue in CMOS IC products. It has known that some CMOS ICs are very susceptible to system-level ESD stress, even though they have passed the component-level ESD specifications such as human-body-model (HBM) of ±2 kV, machine-model (MM) of ±200V, and charged-device-model (CDM) of ±1 kV.

The tendency of guarding against system-level ESD results from the strict requirements of certain reliability test standards, such as system-level ESD tests for electromagnetic compatibility (EMC) regulation. In system-level ESD tests, normal power is provided to the internal circuits of an IC and the internal circuits are operated to perform their default functions. The purpose of system-level ESD tests is to determine whether the internal circuits can keep normal operations even being interfered by ESD noises or whether the circuits can be automatically reset to recover themselves. In the system-level ESD test standard, IEC 61000-4-2, electronic products must sustain the ESD level of +8 kV under contact-discharge test and +15 kV under air-discharge test to meet the immunity requirement of "level 4." High-energy ESD-induced noises often cause damage or malfunction of CMOS ICs inside the equipment under test (EUT).

FIG. 1 illustrates the connecting relationship of a system-level ESD detection circuit 16 and an internal circuit 14 in an IC chip. Under the normal power-on condition, a power-on/reset circuit 12 starts up the internal circuit 14 and resets the ESD detection circuit 16. Thereafter, the internal circuit 14 starts its default operations and the ESD detection circuit 16 starts to detect ESD events. Once a sudden voltage overshoot or undershoot happens on the power rail ($V_{DD}$ or $V_{SS}$), the ESD detection circuit 16 will inform the power-on/reset circuit 12 to perform a protection procedure for the internal circuit 14. This protection procedure may be different in different ICs with various firmware or circuit designs. For instance, the power-on/reset circuit 12 might reset the whole or only one part of the internal circuit 14. By resetting certain circuits, more serious malfunction of the whole chip may be accordingly prevented.

"On-chip transient detection circuit for system-level ESD protection in CMOS integrated circuits to meet electromagnetic compatibility regulation" reported by M.-D. Ker, C.-C. Yen, and P.-C. Shih on IEEE Trans. Electromagnetic Compatibility, vol. 50, no. 1, pp. 1-9, February, 2008 has proposed a system-level ESD detection circuit. Please refer to FIG. 2, which illustrates the ESD detection circuit in the above paper. The capacitors $C_{P1}$ and $C_{P2}$ in FIG. 2 are respectively used for detecting fast transients happened on $V_{DD}$ and $V_{SS}$ when the system is subjected to ESD events.

Initially, the node A is reset to ground by providing a high-level pulse to the gate of the transistor $M_{NR}$ (i.e. the node labeled as Reset). Under the condition without ESD events, the output of the inverter INV3 has a low-level voltage. Once a positive ESD zapping is applied to the $V_{DD}$ power rail in FIG. 2 while the $V_{SS}$ power rail is grounded, the positive ESD voltage will be coupled through the capacitor $C_{P1}$ and raise the voltage at the input of the inverter INV1 (consisting of $M_{P1}$ and $M_{N1}$). Accordingly, the output of the inverter INV3 will then have a high-level voltage. Thereby, a subsequent circuit (e.g. the power-on/reset circuit 12 in FIG. 1) can be aware of the ESD event.

Further, the inverters INV1 and INV2 form a latch to prolong the detected status so that the subsequent circuit can have enough time to respond to this condition. After the subsequent circuit has dealt with the ESD transient noise, the detection circuit in FIG. 2 can be reset again.

It can be seen that the detection circuit in prior arts can only detect ESD events but not the level of ESD voltages. The subsequent circuit in prior arts accordingly can only deal with all ESD events in the same manner instead of performing different measures in response to different ESD levels.

SUMMARY OF THE INVENTION

To solve the aforementioned problem, a scope of the invention is to provide ESD detection circuits capable of judging the level of ESD voltages.

One embodiment according to the invention is an ESD detection circuit including a resistive component, a diode unit, and a controller. The resistive component is coupled between a detection node and a ground node. The diode unit is coupled between a power rail and the detection node in a forward direction toward the power rail. The controller, coupled to the detection node, is used for determining the level of an ESD voltage on the power rail based on the voltage of the detection node and the breakdown voltage of the diode unit.

In other embodiments, the ESD detection circuit according to the invention can include two or more sets of diode and resistor. By properly designing the breakdown voltages of the diodes, the controller can judge the level of an ESD voltage easily. The advantage and spirit of the invention may be understood by the following recitations together with the appended drawings.

BRIEF DESCRIPTION OF THE APPENDED DRAWINGS

Figure 1:
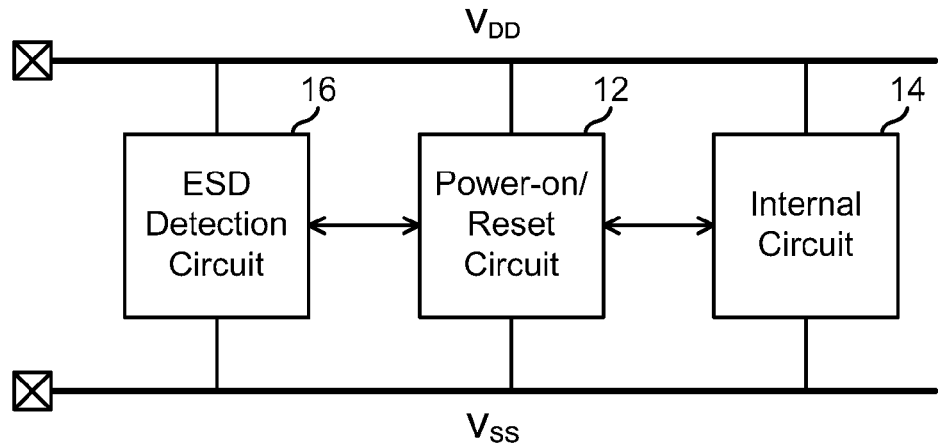
FIG. 1 illustrates the connecting relationship of a system level ESD detection circuit and an internal circuit in an IC chip.
Figure 2:
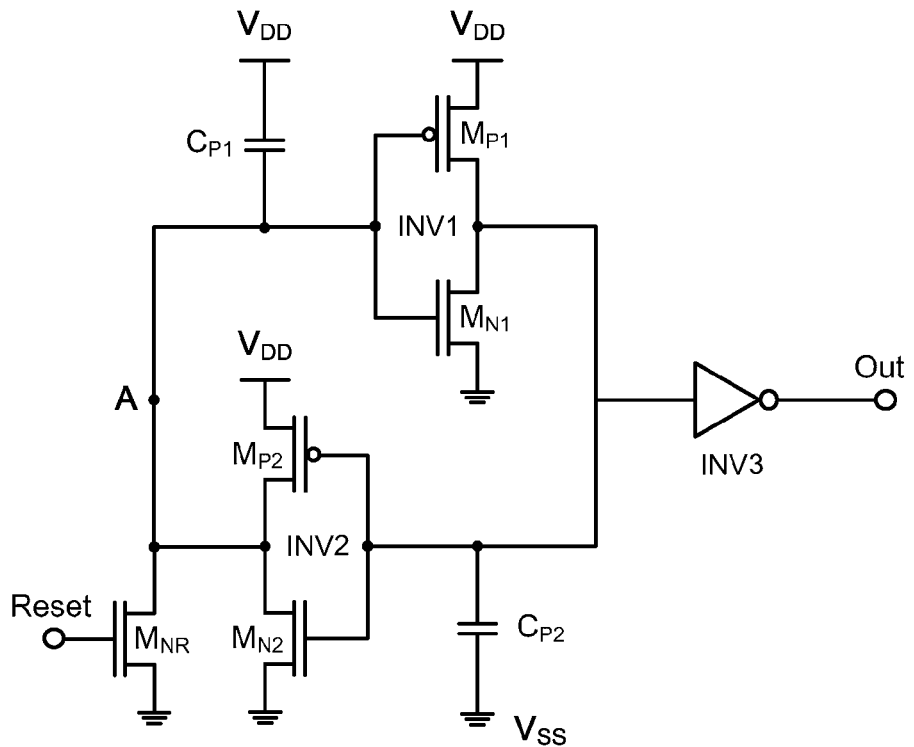
FIG. 2 illustrates an ESD detection circuit in the prior art.
Figure 3A:
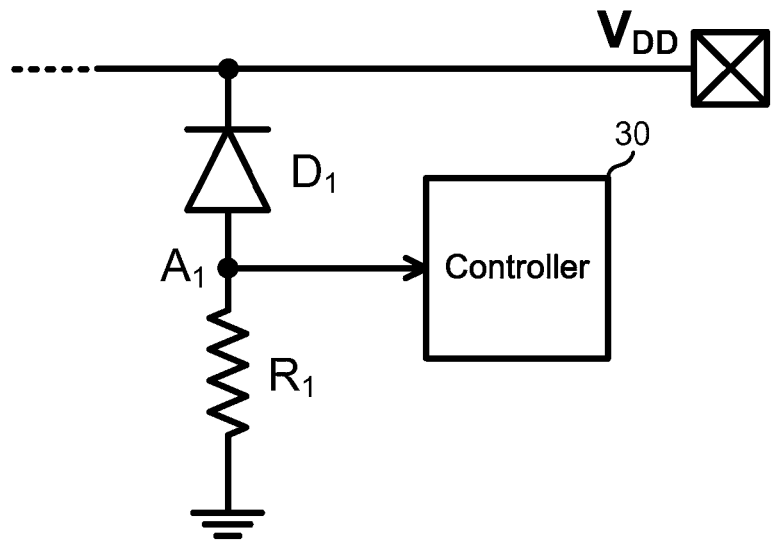
Figure 3B:
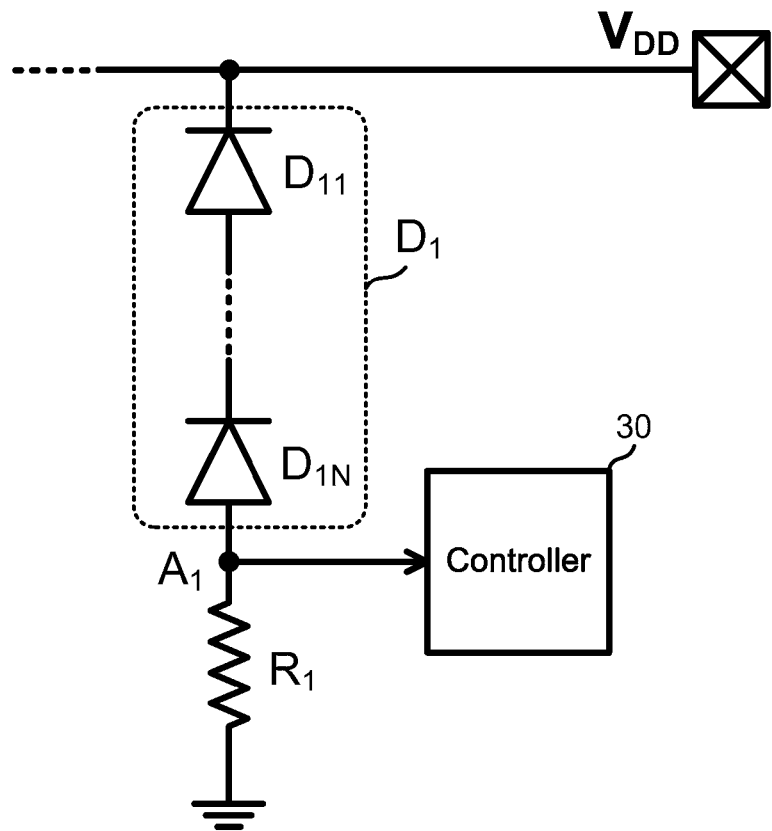

FIG. 3(A) and FIG. 3(B) illustrate the ESD detection circuit in the first embodiment according to the invention.

Figure 4A:
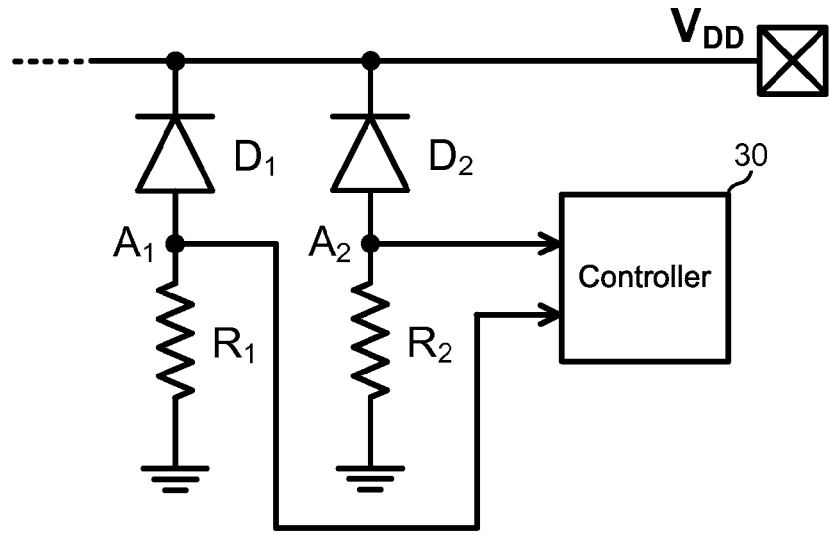
Figure 4B:
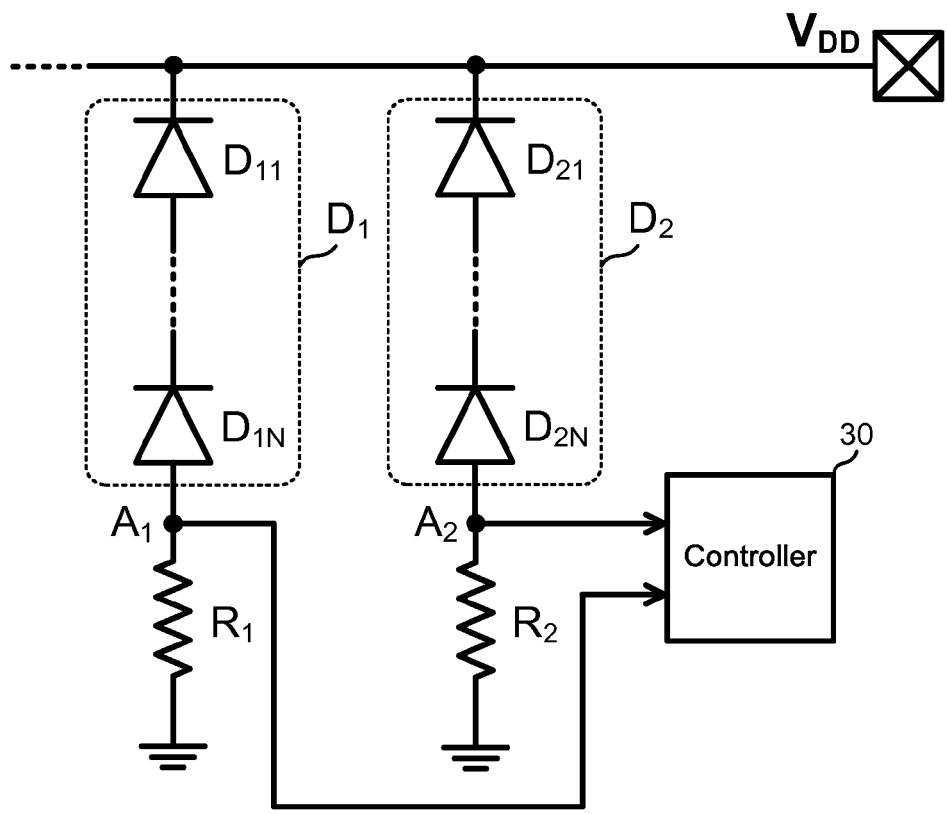

FIG. 4(A) and FIG. 4(B) illustrate the ESD detection circuit in the second embodiment according to the invention.

Figure 5:
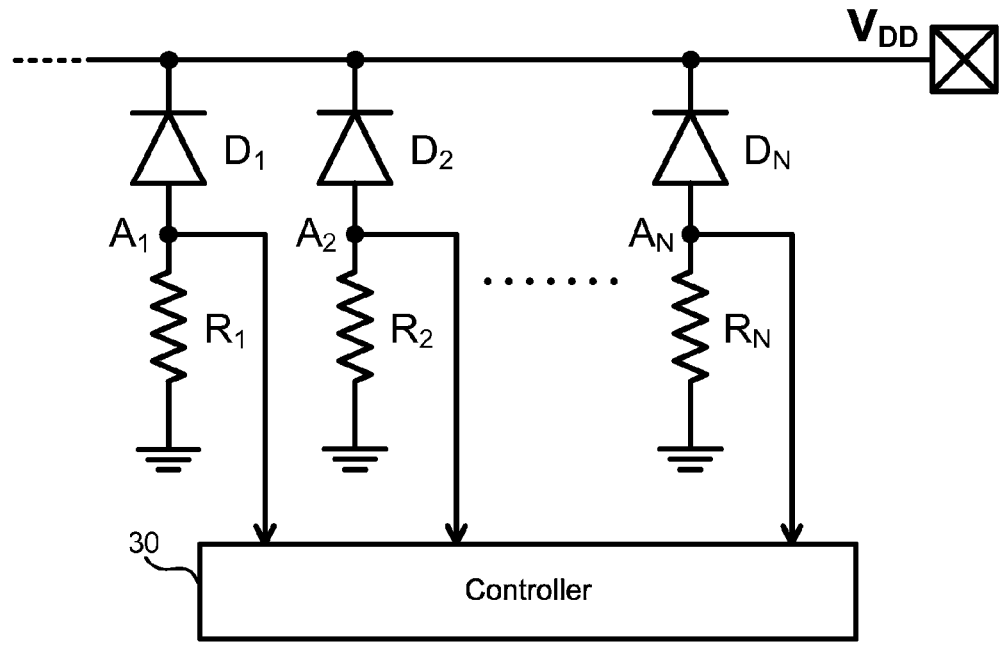

FIG. 5 illustrates an ESD detection circuit including plural sets of diodes and resistors according to the invention.

Figure 6A:
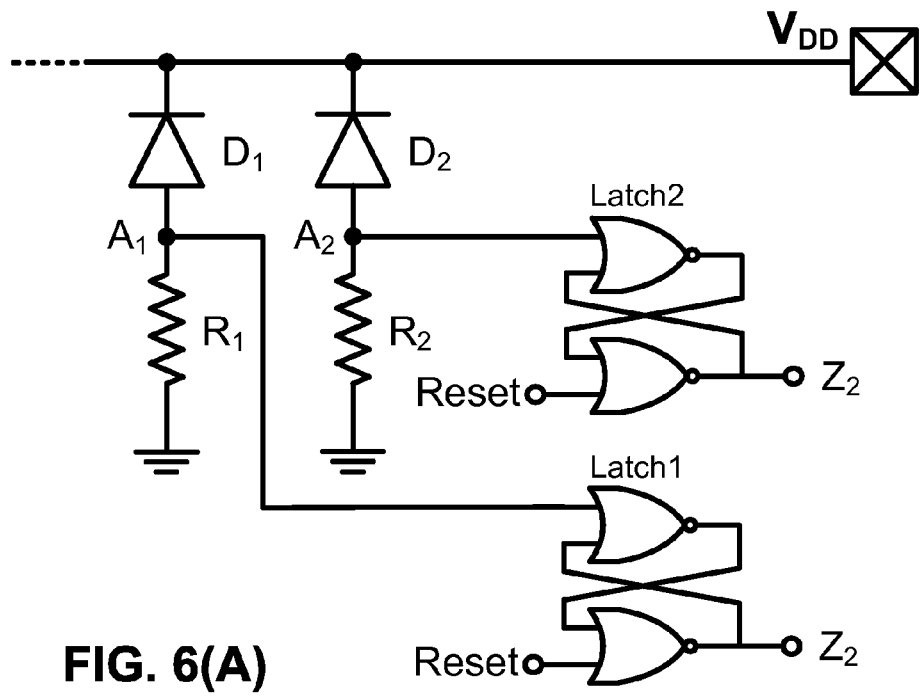
Figure 6B:
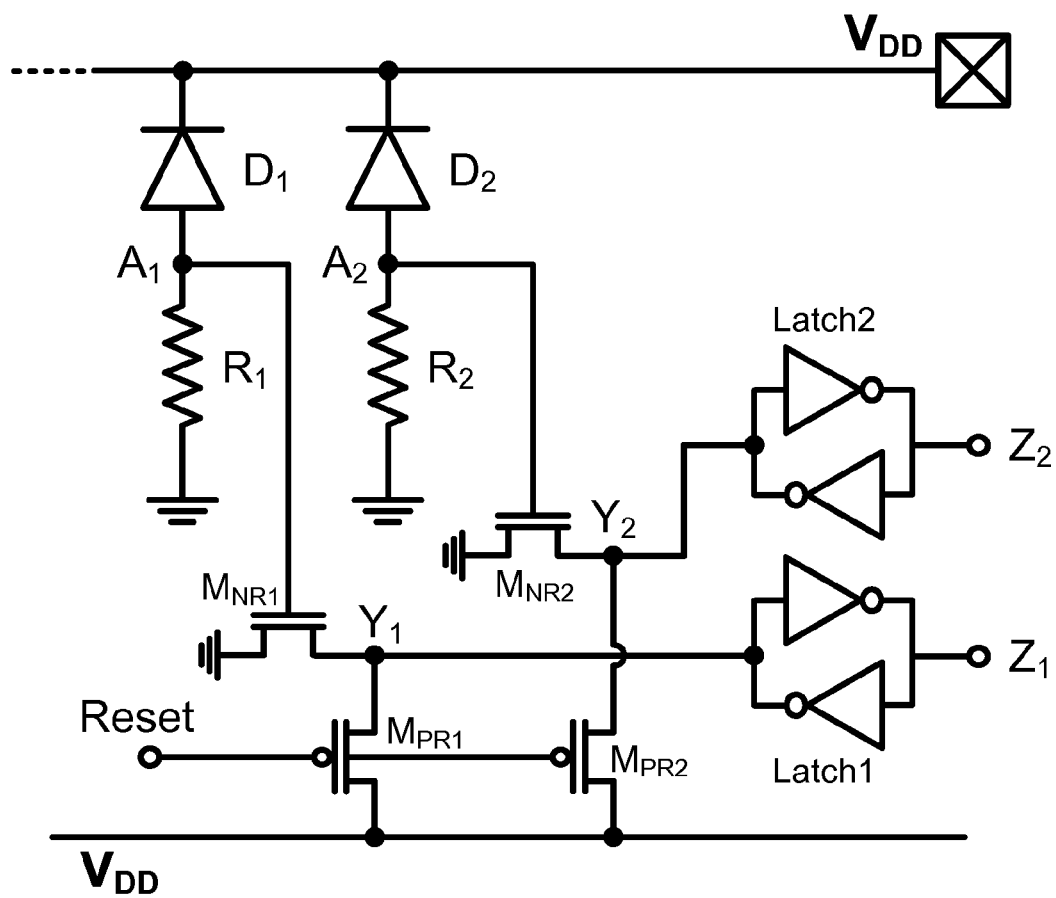

FIG. 6(A) and FIG. 6(B) illustrate exemplary embodiments of ESD detection circuit including latches.

DETAILED DESCRIPTION OF THE INVENTION

Please refer to FIG. 3(A), which illustrates the ESD detection circuit in the first embodiment according to the invention. This detection circuit includes a resistive component $R_1$, a diode unit $D_1$, and a controller 30. As shown in FIG. 3(A), the resistive component $R_1$ is coupled between a detection node $A_1$ and a ground node. The diode unit $D_1$ is coupled between a power rail ($V_{DD}$) and the detection node $A_1$ in a forward direction toward the power rail. The controller 30 is coupled to the detection node $A_1$.

Under normal circuit operations, the diode unit $D_1$ is reversely biased and the node $A_1$ is grounded through the resistive component $R_1$. When an overshoot voltage happens on $V_{DD}$, if the diode unit $D_1$ has a breakdown voltage smaller than the overshoot voltage, the diode unit $D_1$ will conduct a current to flow through the resistive component $R_1$. The voltage at node $A_1$ is therefore raised up and equals the product of the conduction current and the resistor value.

On the contrary, if the diode unit $D_1$ has a breakdown voltage larger than the overshoot voltage, the diode unit $D_1$ will not conduct and the voltage at node $A_1$ is therefore kept low (i.e. same as the ground node). Since the breakdown voltage of the diode unit $D_1$ can be predetermined, the controller 30 can be aware of whether an ESD event having an overshoot voltage larger than the breakdown voltage occurs. More specifically, if the controller 30 detects that node $A_1$ has a high-level voltage, it can determine that an ESD overshoot larger than the breakdown voltage of the diode unit $D_1$ occurred on the power rail. Thereby, the level of an ESD voltage is evaluated.

Please refer to FIG. 3(B), which illustrates an exemplary embodiment of the diode unit $D_1$. In this example, the diode unit $D_1$ includes a plurality of diodes ($D_{11} \sim D_{1N}$) coupled in series. In actual applications, these diodes in the diode unit $D_1$ can all have the same breakdown voltage. In other words, the breakdown voltage of the diode unit $D_1$ is the summation of the breakdown voltages of the plural diodes.

FIG. 4(A) shows the ESD detection circuit in the second embodiment according to the invention. In this embodiment, the detection circuit further includes a resistive component $R_2$ and a diode unit $D_2$. The diode unit $D_1$ has a first breakdown voltage and the diode unit $D_2$ has a second breakdown voltage different from the first breakdown voltage.

For instance, assume the first breakdown voltage is 10V and the second breakdown voltage is 20V. If an overshoot voltage happens on $V_{DD}$ is larger than 20V, both of the diode units will conduct and the voltages at nodes $A_1$ and $A_2$ are both raised up. On the other hand, if an overshoot voltage ranges between 10V and 20V, only the diode unit $D_1$ will conduct and only the voltage at node $A_1$ is raised up. Different voltage combinations of the detection nodes ($A_1$, $A_2$, ... $A_n$) can indicate different ESD levels. By detecting the voltages at nodes $A_1$ and $A_2$, the controller 30 can easily judge the level of ESD voltages.

As illustrated in FIG. 4(B), the diode unit $D_2$ can also include a plurality of diodes coupled in series ($D_{21} \sim D_{2N}$). The more diodes stacked therein, the higher breakdown voltage the diode unit has. In this configuration, the diodes in the diode units $D_1$ and $D_2$ can respectively have the same breakdown voltage. In other words, the difference between the two diode units is the number of diodes. For example, the diode units $D_1$ may include two diodes and the diode units $D_2$ may include four diodes. The advantage of this configuration is that the designer does not have to use diodes with various breakdown voltages.

As shown in FIG. 5, the ESD detection circuit according to the invention can further include more diode units and resistive components (e.g. N sets of diode unit and resistors in this figure) in other embodiments. By adopting more diode units respectively having different breakdown voltages, the controller 30 can detect the level of ESD voltages more accurately. Based on the level of an ESD voltage, the subsequent circuit can perform a corresponding measure.

For example, when a minor ESD event is detected, a subsequent reset circuit can reset none or only one part of internal circuits. On the contrary, when a higher ESD voltage is detected, the reset circuit can reset more or even the whole of the internal circuits. Thereby, the internal circuits do not have to be completely reset whenever an ESD event occurs. A more flexible ESD protection policy is accordingly provided.

Further, when the system is subjected to a negative system level ESD stress, the transient voltage on $V_{DD}$ power bus usually first undershoots to a certain level and then overshoots to be higher than $V_{DD}$. Therefore, the detection circuits in FIG. 3(A) through FIG. 5 can still detect this ESD event.

In general, an ESD stress has time duration of several hundreds of nanoseconds. After the ESD stress has vanished, the voltage on $V_{DD}$ bus recovers to normal state. The voltages on the detection nodes ($A_1 \sim A_N$) are then pulled down to ground through the resistors. To store the detected signal and provide more response time for subsequent circuits, latches can be added in the controller 30.

Please refer to FIG. 6(A), which illustrates an exemplary embodiment of an ESD detection circuit including latches. In this example, the latches are set/reset latches composed of NOR gates. Taking the detection node $A_1$ as an example, a high-level pulse at node $A_1$ is equivalent to a "set" signal for the latch connected to node $A_1$ (Latch 1). In other words, when the voltage at node $A_1$ is raised by an ESD stress, Latch 1 is then set. Hence, the output node $Z_1$ is also raised up.

Normally, a low-level voltage (i.e. ground level) is provided to the reset terminal of the latches. Even if the voltage at node $A_1$ recovers to ground after the ESD event vanished, the voltage at the output node $Z_1$ is kept high by Latch 1. In the same manner, the detected result of node $A_2$ can be maintained by the latch connected to node $A_2$ (Latch 2). With the latches, the subsequent circuit or firmware can have enough time to control the system to respond to this ESD transition.

After the level of the ESD voltage has been determined, a high-level pulse can be provided to the reset pins of the latches. After the latches are reset, the voltages of the detection nodes $Z_1$ and $Z_2$ are both pulled low again. Thereby, the detection circuit is recovered to the status capable of detecting another ESD event. In actual applications, latches of other formats can also be utilized in the detection circuit according to the invention.

FIG. 6(B) shows another exemplary embodiment of an ESD detection circuit including latches. In this example, the latches are composed of inverters connected to each other. Initially, a low-level pulse is provided to the gates of the two PMOSs ($M_{PR1}$ and $M_{PR2}$) through the reset pin. Thereby, the voltages at nodes $Y_1$ and $Y_2$ are pulled high and the voltages at nodes $Z_1$ and $Z_2$ are then latched at low-level.

Taking the detection node $A_1$ as an example, once an ESD voltage larger than the breakdown voltage of the diode unit $D_1$ occurs on $V_{DD}$, the voltage on node $A_1$ will be pulled high. Subsequently, the NMOS $M_{NR1}$ is turned on and pulls down the voltage of node $Y_1$. The output of Latch 1 is accordingly pulled high and indicates the occurrence of an ESD event. After the ESD transition has vanished, $A_1$ is pulled low through the resistive component $R_1$ but $Y_1$ will still be kept low. The ESD transient event can therefore be stored by the Latch 1. The voltage on node $A_2$ can be latched by Latch 2 in the same manner. As a result, different digital codes at the outputs of the latches can represent different levels of the ESD stress.

To reset the ESD detection circuit, a low-level pulse is provided to the gates of the two PMOSs through the reset pin again. The nodes $Y_1$ and $Y_2$ are pulled high through the PMOS and the voltage levels of nodes $Z_1$ and $Z_2$ are reset to 0. The ESD detection circuit can therefore detect another ESD stress. Moreover, the idea of utilizing multiple diodes coupled in series can be applied in the circuits in FIG. 6(A) and FIG. 6(B), too.

Compared with the prior arts, the ESD detection circuits according to the invention can detect not only the occurrence of ESD events but also the level of an ESD voltage. Based on the level of an ESD voltage, the subsequent circuit can perform a corresponding measure. Therefore, a flexible ESD protection policy can be provided. Further, because the structure and components therein are quite simple, the ESD detection circuits according to the invention can be implemented easily.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An ESD detection circuit for detecting a level of an ESD voltage on a power rail, comprising:
   a first resistive component coupled between a first detection node and a ground node corresponding to the power rail;
   a first diode unit coupled between the power rail and the first detection node in a forward direction toward the power rail, the first diode unit having a first breakdown voltage;
   a second resistive component coupled between a second detection node and the ground node;
   a second diode unit coupled between the power rail and the second detection node in a forward direction toward the power rail, the second diode unit having a second breakdown voltage different from the first breakdown voltage; and
   a controller, coupled to the first detection node, for determining the level of the ESD voltage based on the voltage of the first detection node and the first breakdown voltage, wherein the controller is also coupled to the second detection node, and the controller determines the level of the ESD voltage further based on the voltage of the second detection node and the second breakdown voltage.

2. The ESD detection circuit of claim 1, wherein the first diode unit comprises a plurality of diodes coupled in series.

3. The ESD detection circuit of claim 2, wherein the plural diodes in the first diode unit all have the same breakdown voltage, and the first breakdown voltage is the summation of the breakdown voltages of the plural diodes.

4. The ESD detection circuit of 1, wherein the second diode unit comprises a plurality of diodes coupled in series.

5. The ESD detection circuit of claim 4, wherein the plural diodes in the second diode unit all have the same breakdown voltage, and the second breakdown voltage is the summation of the breakdown voltages of the plural diodes.

6. The ESD detection circuit of claim 1, wherein the controller comprises:
   a latch, coupled to the first detection node, for latching the voltage of the first detection node.

7. The ESD detection circuit of claim 6, wherein the latch is a set/reset latch;
   and the latch is reset after the level of the ESD voltage has been determined.

8. The ESD detection circuit of claim 1, wherein the controller comprises:
   a latch, coupled to the first detection node, for latching a relative voltage that changes according to the voltage of the first detection node.

9. The ESD detection circuit of claim 8, wherein the controller further comprises:
   an NMOS, a gate terminal of the NMOS being coupled to the first detection node, a source terminal of the NMOS being coupled to the ground node, a drain terminal of the NMOS being coupled to the latch, and the relative voltage being the voltage of the drain terminal of the NMOS.

10. The ESD detection circuit of claim 9, wherein the controller further comprises:
    a PMOS, a gate terminal of the PMOS being coupled to a reset pin, a source terminal of the PMOS being coupled to the power rail, a drain terminal of the PMOS being coupled to the drain terminal of the NMOS;
    wherein a high-level voltage is provided to the reset pin when the ESD detection circuit is waiting for the ESD voltage, and a low-level voltage is provided to the reset pin after the level of the ESD voltage has been determined.

* * * * *